(12) United States Patent
Norte et al.

(10) Patent No.: US 6,720,494 B1
(45) Date of Patent: Apr. 13, 2004

(54) CABINET GASKET PROVIDING PANEL ADHESION AND ELECTROMAGNETIC INTERFERENCE SHIELDING

(75) Inventors: David A. Norte, Adams, CO (US); Woong K. Yoon, Adams, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 10/272,240

(22) Filed: Oct. 15, 2002

(51) Int. Cl.[7] .................................................. H05K 9/00
(52) U.S. Cl. ............................ 174/35 GC; 174/35 MS; 439/927
(58) Field of Search ...................... 174/35 GC, 35 MS, 174/36, 35 R; 439/927, 939; 361/816, 818

(56) References Cited

U.S. PATENT DOCUMENTS

| 3,889,043 A | * | 6/1975 | Jean Ducros | 174/35 GC |
| 3,969,572 A | * | 7/1976 | Rostek | 174/35 MS |
| 4,791,236 A | * | 12/1988 | Klein et al. | 174/36 |
| 4,820,885 A | * | 4/1989 | Lindsay | 174/35 GC |
| 6,429,370 B1 | | 8/2002 | Norte et al. | 174/35 GC |

* cited by examiner

Primary Examiner—Dean A. Reichard
Assistant Examiner—Carmelo Oliva
(74) Attorney, Agent, or Firm—David Volejnicek

(57) ABSTRACT

An electromagnetic gasket (110) combines a compressible substrate (300, 504/504', 804) carrying a conductive material (302, 502, 802) and a hook-and-loop fastener (114/304, 400/504/504', 804) to provide both the mechanical function of removably mounting a door (102) on a cabinet (100) and the electromagnetic function of shielding against EMI emissions even if the door becomes warped.

26 Claims, 2 Drawing Sheets

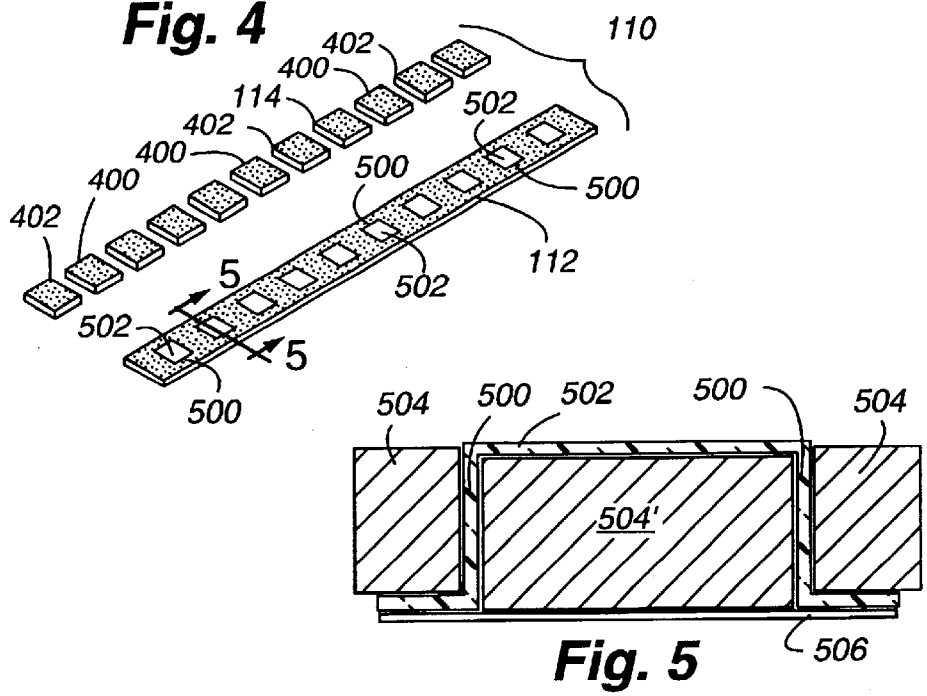
Fig. 4
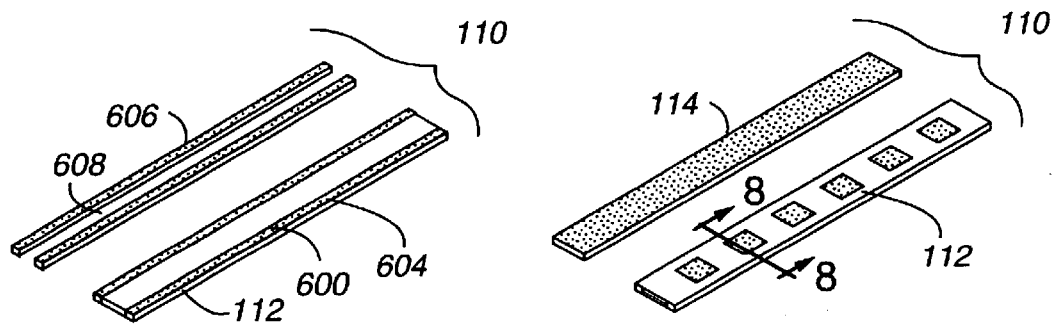
Fig. 5
Fig. 6 Fig. 7
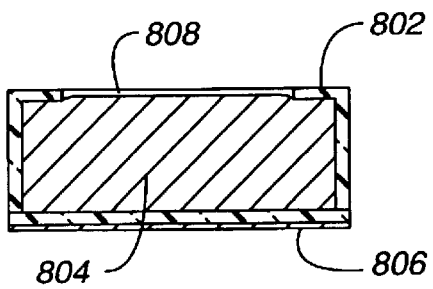
Fig. 8

CABINET GASKET PROVIDING PANEL ADHESION AND ELECTROMAGNETIC INTERFERENCE SHIELDING

TECHNICAL FIELD

This invention relates to electromagnetic interference (EMI) shielding.

BACKGROUND OF THE INVENTION

The prior art contains myriad designs of EMI shielding gaskets for doors or access panels of cabinets for housing electrical or electronic equipment. Some designs, such as a woven conductive sheath applied over a strip of pliable foam material, or a strip of rubber impregnated with particles of conductive metal, provide a good seal against electromagnetic emissions through the space between the door or panel and the rest of the cabinet, sometimes even when the door or access panel warps. However, they require the use of a latching mechanism therewith to attach the door or panel to the cabinet and to keep it closed. The trouble of latching and unlatching the latching mechanism encourages service personnel to simply remove the door or panel and keep the cabinet open, thereby defeating the purpose of EMI shielding.

Magnetic latches and gaskets, which rely upon magnetic attraction between a door or a panel and a cabinet, are also known. For example, U.S. Pat. No. 6,429,370 B1 discloses use of magnetic tape to form an EMI seal between a cabinet and a door and to adhere the door to the cabinet. The magnets are hard, that is, not compressible, physically. Therefore, a "gasket" consisting of a magnetic strip does not always provide a good seal between the door or panel and the cabinet, and may allow electromagnetic emissions to leak out if the panel or door warps.

SUMMARY OF THE INVENTION

This invention is directed to solving these and other problems and disadvantages of the prior art. Generally according to the invention, a pliable (e.g., compressible) gasket provides both the mechanical function of keeping a door or a panel mounted on (e.g., closed and tightly sealed against) a cabinet and the electromagnetic function of shielding against EMI emissions even if the door or panel becomes warped.

Specifically according to the invention, a gasket for preventing emissions of electromagnetic radiation from a cabinet having an opening and a panel for mounting over the opening comprises a first and a second half of the gasket, with the first half of the gasket comprising a first half of a self-engaging disengageable and reengageable fastener, such as a hook-and-loop fastener, for surrounding the opening, and with the second hag of the gasket comprising a second half of the fastener for engaging the first half of the fastener when the panel is mounted over the opening, and a material that blocks electromagnetic radiation carried by a pliable substrate for surrounding the opening and conforming to the shape of the space between the periphery and the panel when the panel is mounted over the opening.

This structure not only effectively seals the cabinet against emission of electromagnetic radiation from the cabinet, but also mounts the panel on the cabinet to keep the opening into the cabinet closed and tightly sealed, yet allows for easy removal and subsequent remounting of the panel.

BRIEF DESCRIPTION OF THE DRAWING

These and other features and advantages of the invention will become more apparent from the following descriptions of illustrative embodiments of the invention considered together with the drawing, wherein:

FIG. 4 is a perspective-view diagram of a second illustrative embodiment of the gasket of the cabinet of FIG. 1;

FIG. 5 is a cross-section diagram of a first half of the gasket of FIG. 4;

FIG. 6 is a perspective-view diagram of a third illustrative embodiment of the gasket of the cabinet of FIG. 1;

FIG. 7 is a perspective-view diagram of a fourth illustrative embodiment of the gasket of the cabinet of FIG. 1; and FIG. 8 is a cross-section diagram of a first half of the gasket of FIG. 7.

DETAILED DESCRIPTION

Figure 1:
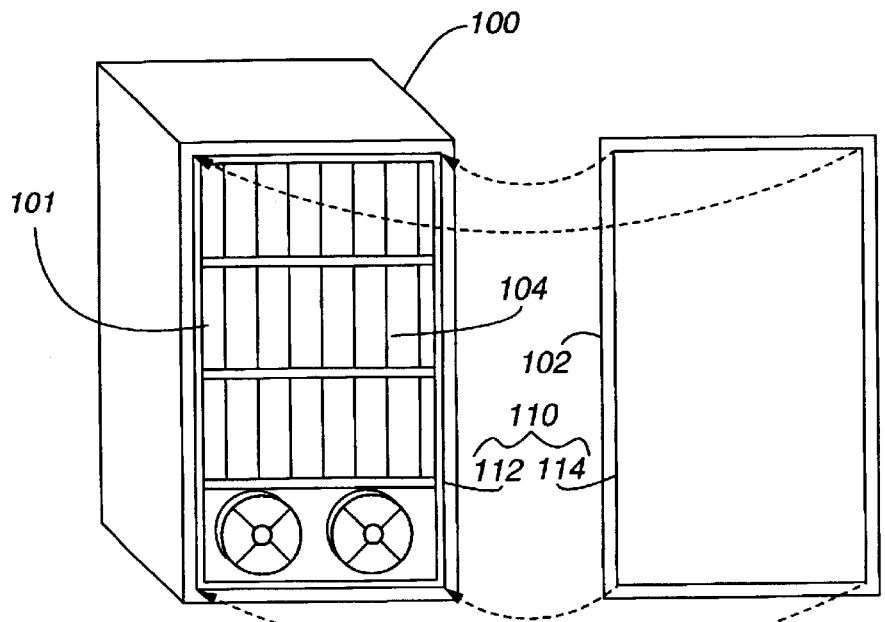
FIG. 1 is a perspective view of an electronic-equipment cabinet that includes an illustrative embodiment of the invention.

FIG. 1 shows a cabinet 100 for holding electronic equipment 104. One side of cabinet 100 defines an opening 101 into cabinet 100. Opening 101 is normally closed by an access panel (e.g., a door) 102 that is openably, and preferably removably, mounted on cabinet 100 over opening 101. The outer periphery of opening 101 carries a first half 112 of an EMI shielding gasket 110, while the outer periphery of panel 102 carries a second half 114 of gasket 110.

According to the invention, gasket 110 provides both the electromagnetic function of shielding against EMI emissions from equipment 104 out of cabinet 100 and the mechanical function of keeping panel 102 mounted on, closed, and tightly sealed against, the rest of cabinet 100. Gasket 110 uses a combination of a self-engaging disengageable and reengageable fastener, such as a Velcro® hook-and-loop fastener, and a pliable (e.g., compressible) EMI shielding material to provide these functions.

Figure 2:
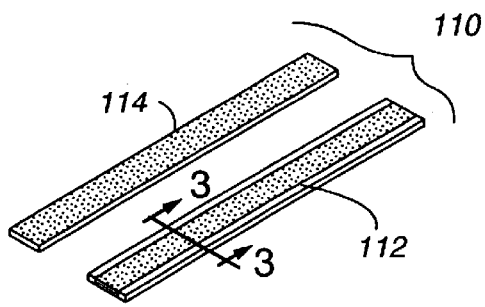
FIG. 2 is a perspective-view diagram of a first illustrative embodiment of a gasket of the cabinet of FIG. 1.
Figure 3:
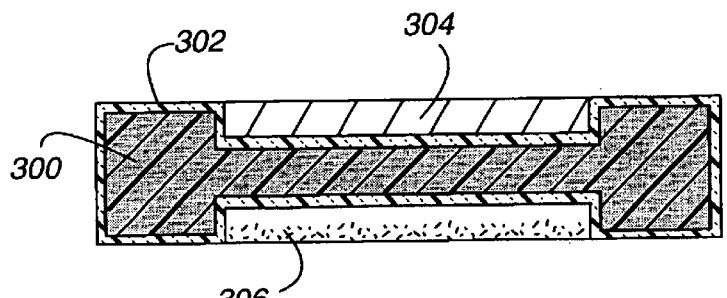
FIG. 3 is a cross-section diagram of a first half of the gasket of FIG. 2.

FIGS. 2 and 3 show a first illustrative embodiment of gasket 110. As shown in FIG. 2, second half 114 of gasket 110 is merely a strip of one of the hook and the loop material of the hook-and-loop fastener. First half 112 of gasket 110 is shown in cross-section in FIG. 3. It comprises a material 302 that blocks EMI radiation, such as a conductive foil or a conductive woven material, and a pliable material 300, such as foam, that carries material 302. As shown in FIG. 3, material 302 illustratively encapsulates pliable foam material 300 which has an "I"-shaped cross-section. One channel of the "I"-shape is occupied by the other 304 of the hook and the loop material of the hook-and-loop fastener, and the other channel of the "I"-shape is occupied by an adhesive 306 that attaches first half 112 of gasket 110 to cabinet 100. The width of second half 114 of gasket 110 is preferably no more than the width of material 304. Of course, the positions of the two halves 112 and 114 of gasket 110 can be interchanged, with first half 112 being mounted on panel 102 and second half 114 being mounted on cabinet 100.

During use, when panel 102 is mounted on cabinet 100, the two halves of the hook-and-loop fastened adhere to, or engage, each other, and keep panel 102 mounted on and pulled tightly against cabinet 100. The adhesion between the two halves of the hook-and-loop fastener compresses foam 300 between panel 102 and cabinet 100 and foam 300 and material 302 conform to the shape of the space between panel 102 and cabinet 100, thus forming a tight seal between them and compensating for any irregularities, such as those caused by buckling of panel 102. Material 302 around foam 300 provides a double-layer of protection against electromagnetic radiation leakage out of cabinet 100. The two halves of the hook-and-loop fastener are disengaged and panel 102 is dismounted from cabinet 100 merely by pulling panel 102 off of cabinet 100.

Use of a full strip of hook or loop material for second half 114 of gasket 110 may make removal of panel 102 from cabinet 100 too difficult because of the strength of adhesion between the two halves of gasket 110. To adjust, or lessen, this force of adhesion, first half 114 of gasket 110 may be formed of periodically-spaced strips, instead of an uninterrupted strip, of the hook or loop material. Alternatively, the density of the hooks in the hook material may be reduced, thereby lessening the force of adhesion between the two halves of gasket 110. Also, the two halves of gasket 110 need not be attached to cabinet 100 and panel 102 by adhesive, but rather may be attached by any desired means, e.g., rivets, screws, through-hole pop plugs, etc.

A second illustrative embodiment of gasket 110 is shown in FIGS. 4 and 5. In this embodiment, first half 112 of gasket 110, shown in cross-section in FIG. 5, is made of patches or strips 502 of the conductive shielding material woven into or adhered onto the hook or loop material 504/504' through periodically-spaced slots 500. In this embodiment, portion 504' of material 504/504' provides the function of foam 300 of the embodiment of FIG. 3. Second half 114 of gasket 110 is made of strips 400 of the complementary hook or loop material, with gaps 402 in-between strips 400 being sized and shaped to accommodate strips 502 when panel 102 is mounted on cabinet 100. So long as the spacing between strips 502 of the conductive material is less than one-half the wavelength of the highest frequency of radiation that the EMI-shielding gasket 110 is to block, strips 502 of conductive material suffice. However, it is easily envisioned that, instead of using strips of material 502, a single continuous strip 604 of the conductive material may be used and would be woven into or adhered onto material 504/504' through a single, long, continuous slot 600, as shown in FIG. 6. In such an implementation, only the outer portion 504 of material 504/504' would provide the gripping action to adhere first half 112 of gasket 110 to second half 114. In this implementation, second half 114 of gasket 110 is formed of two side-by-side strips 606 of the complementary hook or loop material with a space 608 in-between them to accommodate strip 604, also as shown in FIG. 6.

As in the case of the embodiment of FIGS. 2 and 3, illustratively a layer of adhesive 506 attaches first half 112 of gasket 110 to panel 102 or cabinet 100 in the embodiments of FIGS. 4-6.

A fourth illustrative embodiment of gasket 110 is shown in FIGS. 7 and 8. In this embodiment, second half 114 of gasket 110 remains unchanged from FIG. 2. But in first half 112 of gasket 110, shown in cross-section in FIG. 8, shielding material 802 completely encapsulates hook or loop material 804 except for periodically-spaced cutouts 808. Cutouts 808 allow hook or loop material 804 of first half 112 of gasket 110 to protrude and engage the loop or hook material of second half 114, and second half 114 is preferably no wider than the width of cutouts 808. Attentively, in the embodiment of FIGS. 7-8, second half 114 of gasket 110 may be constructed identically to first half 112 but using the other of the hook or loop material from the one used in the construction of first half 112.

As in the case of the embodiments of FIGS. 2-6, a layer of adhesive 806 attaches first half 112 of gasket 110 to panel 102 of cabinet 100 in the embodiments of FIGS. 7-8.

Of course, various changes and modifications to the illustrative embodiments described above will be apparent to those skilled in the art. For example, the pliable material may be made magnetic by embedding pieces or a strip of magnet therein, and if the cabinet is magnetic (e.g., steel), the hook-and-loop fastener may be dispensed with because the magnet and the cabinet will together act as a self-engaging disengageable and reengageable fastener. Such changes and modifications can be made without departing from the spirit and the scope of the invention and without diminishing its attendant advantages. It is therefore intended that such changes and modifications be covered by the following claims.

What is claimed is:

1. An apparatus for preventing emissions of electromagnetic radiation, comprising:

a cabinet having an opening;

a panel for mounting over the opening;

a first half of a casket comprising a first half of a self-engaging disengageable and reengageable fastener, surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the substrate comprises a compressible material having a substantially "I"-shaped cross-section forming a first and second channel in the compressible material;

the material that blocks electromagnetic radiation comprises a conductive sheath encapsulating the compressible material; and the second half of the gasket further comprises the second half of the fastener mounted in the first channel, and an adhesive mounted in the second channel for mounting the second half of the gasket to the other of the cabinet and the panel.

2. The apparatus of claim 1 wherein:

the fastener comprises a hook-and-loop fastener.

3. The apparatus of claim 1 wherein:

the first half of the fastener comprises a magnetic body of one of the cabinet and the panel; and the second half of the fastener comprises a magnet carried by the substrate.

4. The apparatus of claim 1 wherein the substrate comprises a compressible material; and the material that blocks electromagnetic radiation comprises a planar pliable conductor mounted on the compressible material.

5. The apparatus of claim 1 wherein:

the compressible material comprises a compressible foam; and the planar pliable conductor comprises one of a conductive foil and a woven conductive sheath.

6. An apparatus for preventing emissions of electromagnetic radiation, comprising:

a cabinet having an opening;

a panel for mounting over the opening;

a first half of a gasket comprising a first half of a self-engaging disengageable and reengageable fastener, surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphen of the opening and the panel, when the panel is mounted over the opening; wherein:

the first half of the gasket comprises spaced-apart strips of the first half of the fastener;

the substrate comprises the second half of the fastener; and the material that blocks electromagnetic radiation comprises spaced-apart conductive strips mounted on the second half of the fastener and spaced such that the conductive strips fit between the strips of the first half of the fastener when the panel is mounted over the opening.

7. The apparatus of claim 6 wherein:
the fastener comprises a hook-and-loop fastener.

8. An apparatus for preventing emissions of electromagnetic radiation, comprising:

a cabinet having an opening;

a panel for mounting over the opening;

a first half of a gasket comprising a first half of a self-engaging disengageable and reengageable fastener, surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the first half of the gasket comprises a pair of side-by-side strips of the first half of the fastener;

the substrate comprises a strip of compressible material;

the material that blocks electromagnetic radiation comprises a strip of conductor mounted on the compressible material; and the second half of the fastener comprises a pair of side-by-side strips of the second half of the fastener mounted alongside the strip of compressible material such that the strips of the first half of the fastener engage the strips of the second half of the fastener and the strip of conductor fits between the strips of the first half of the fastener when the panel is mounted over the opening.

9. The apparatus of claim 8 wherein:
the fastener comprises a hook-and-loop fastener.

10. An apparatus for preventing emissions of electromagnetic radiation, comprising:

a cabinet having an opening;

a panel for mounting over the opening;

a first half of a gasket comprising a first half of a self-engaging disengageable and reengageable fastener, surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the substrate comprises the second half of the fastener; and the material that blocks electromagnetic radiation comprises a conductive sheath encapsulating the second half of the fastener and having a surface for contacting the first half of the gasket, the conductive sheath defining a plurality of spaced-apart openings in the surface that are each bounded by the conductive sheath on all sides and that enable the second half of the fastener to protrude therethrough to engage the first half of the fastener when the panel is mounted over the opening.

11. The apparatus of claim 10 wherein:
the fastener comprises a hook-and-loop fastener.

12. An apparatus for preventing emissions of electromagnetic radiation, comprising:

a cabinet having an opening;

a panel for mounting over the opening;

a first half of a gasket comprising a first half of a self-engaging disengageable and reengageable fastener, surrounding the opening; and a second half of the casket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the substrate comprises the second half of the fastener;

the material that blocks electromagnetic radiation comprises a conductive sheath encapsulating the second half of the fastener and defining spaced-apart openings that enable the second half of the fastener to protrude therethrough to engage the first half of the fastener when the panel is mounted over the opening; and the first half of the gasket further comprises
a conductive sheath encapsulating the first half of the fastener and defining spaced-apart openings that enable the first half of the fastener to protrude therethrough to engage the second half of the fastener when the panel is mounted over the opening.

13. The apparatus of claim 12 wherein:
the fastener comprises a hook-and-loop fastener.

14. A gasket for preventing emissions of electromagnetic radiation from a cabinet having an opening and a panel for mounting over the opening, comprising:

a first half of a gasket comprising a first half of a self-engaging disengageable and reengageable fastener, for surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the substrate comprises a compressible material having a substantially "I"-shaped cross-section forming a first and second channel in the compressible material;

the material that blocks electromagnetic radiation comprises a conductive sheath encapsulating the compressible material; and the second half of the gasket further comprises the second half of the fastener mounted in the first channel, and an adhesive mounted in the second channel for mounting the second half of the gasket to the other of the cabinet and the panel.

15. The gasket of claim 14 wherein:

the fastener comprises a hook-and-loop fastener.

16. The gasket of claim 14 wherein:

the first half of the fastener comprises a magnetic body of one of the cabinet and the panel; and the second half of the fastener comprises a magnet carried by the substrate.

17. The gasket of claim 14 wherein the substrate comprises a compressible material; and the material that blocks electromagnetic radiation comprises a planar pliable conductor mounted on the compressible material.

18. The gasket of claim 14 wherein:

the compressible material comprises a compressible foam; and the planar pliable conductor comprises one of a conductive foil and a woven conductive sheath.

19. A gasket for preventing emissions of electromagnetic radiation from a cabinet having an opening and a panel for mounting over the opening, comprising:

a first half of a gasket comprising a first half of a self-engaging disengageable and reengageable fastener, for surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the first half of the gasket comprises spaced-apart strips of the first half of the fastener;

the substrate comprises the second half of the fastener; and the material that blocks electromagnetic radiation comprises spaced-apart conductive strips mounted on the second half of the fastener and spaced such that the conductive strips fit between the strips of the first half of the fastener when the panel is mounted over the opening.

20. The gasket of claim 19 wherein:

the fastener comprises a hook-and-loop fastener.

21. A gasket for preventing emissions of electromagnetic radiation from a cabinet having an opening and a panel for mounting over the opening, comprising:

a first half of a gasket comprising a first half of a self-engaging disengageable and reengageable fastener, for surrounding the opening; and a second half of the gasket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the first half of the gasket comprises a pair of side-by-side strips of the first half of the fastener;

the substrate comprises a strip of compressible material;

the material that blocks electromagnetic radiation comprises a strip of conductor mounted on the compressible material; and the second half of the fastener comprises a pair of side-by-side strips of the second half of the fastener mounted alongside the strip of compressible material such that the strips of the first half of the fastener engage the strips of the second half of the fastener and the strip of conductor fits between the strips of the first half of the fastener when the panel is mounted over the opening.

22. The gasket of claim 21 wherein:

the fastener comprises a hook-and-loop fastener.

23. A gasket for preventing emissions of electromagnetic radiation from a cabinet having an opening and a panel for mounting over the opening, comprising:

a first half of a gasket comprising a first half of a self-engaging disengageable and reengageable fastener, for surrounding the opening; and a second half of the casket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the substrate comprises the second half of the fastener; and the material that blocks electromagnetic radiation comprises a conductive sheath encapsulating the second half of the fastener and having a surface for contacting the first half of the gasket, the conductive sheath defining a plurality of spaced-apart openings in the surface that are each bounded by the conductive sheath on all sides and that enable the second half of the fastener to protrude therethrough to engage the first half of the fastener when the panel is mounted over the opening.

24. The gasket of claim 23 wherein:

the fastener comprises a hook-and-loop fastener.

25. A gasket for preventing emissions of electromagnetic radiation from a cabinet having an opening and a panel for mounting over the opening, comprising:

a first half of a gasket comprising a first half of a self-engaging disengageable and reengageable fastener, for surrounding the opening; and a second half of the casket comprising a second half of the fastener for engaging the first half of the fastener when the panel is mounted over the opening, a pliable substrate, and a material that blocks electromagnetic radiation, carried by the substrate, the substrate and the material for surrounding the opening and conforming to a shape of a space between a periphery of the opening and the panel, when the panel is mounted over the opening; wherein:

the substrate comprises the second half of the fastener;

the material that blocks electromagnetic radiation comprises a conductive sheath encapsulating the second half of the fastener and defining spaced-apart openings that enable the second half of the fastener to protrude therethrough to engage the first half of the fastener when the panel is mounted over the opening; and the first half of the gasket further comprises a conductive sheath encapsulating the first half of the fastener and defining spaced-apart openings that enable the first half of the fastener to protrude therethrough to engage the second half of the fastener when the panel is mounted over the opening.

26. The gasket of claim 25 wherein:

the fastener comprises a hook-and-loop fastener.

* * * * *